(12) United States Patent
Ismail et al.

(10) Patent No.: US 7,432,130 B2
(45) Date of Patent: Oct. 7, 2008

(54) METHOD OF PACKAGING SEMICONDUCTOR DIE WITHOUT LEAD FRAME OR SUBSTRATE

(75) Inventors: Aminuddin Ismail, Selangor Darul Ehsan (MY); Chee Seng Foong, Selangor (MY); Ruzaini Ibrahim, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 385 days.

(21) Appl. No.: 11/341,303

(22) Filed: Jan. 27, 2006

(65) Prior Publication Data

US 2007/0178626 A1 Aug. 2, 2007

(51) Int. Cl.
  *H01L 21/00* (2006.01)
(52) U.S. Cl. ............... 438/108; 257/778; 257/E23.116
(58) Field of Classification Search .......... 257/E23.116, 257/E21.511; 438/108, 118
See application file for complete search history.

(56) References Cited

U.S. PATENT DOCUMENTS

| 6,278,177 | B1 | 8/2001 | Ryu |
| 6,507,120 | B2 | 1/2003 | Lo et al. |
| 6,818,976 | B2 | 11/2004 | Kang et al. |
| 2002/0079592 | A1 | 6/2002 | Lo et al. |
| 2005/0006787 | A1* | 1/2005 | Chiu .......................... 257/777 |
| 2005/0104226 | A1 | 5/2005 | Chang et al. |
| 2005/0284918 | A1* | 12/2005 | Martin et al. .......... 228/180.22 |
| 2006/0234421 | A1* | 10/2006 | Lo et al. ..................... 438/106 |
| 2007/0063331 | A1* | 3/2007 | Kwon et al. ................ 257/686 |

* cited by examiner

*Primary Examiner*—Matthew Smith
*Assistant Examiner*—Walter H Swanson
(74) *Attorney, Agent, or Firm*—Charles Bergere

(57) ABSTRACT

A method of packaging a semiconductor die (10) includes providing a flip-chip die (10) with bump connections (12) on its bottom surface (14). An adhesive tape (18) is attached to a plate surface (16) and lead fingers (20) are formed on the tape (18). The die (10) is placed on the tape (18) such that the bumps (12) on the die (10) contact respective ones of the lead fingers (20) on the tape (18). A reflow process is performed on the die (10), the tape (18) and the plate (16), which forms C5 type interconnects. A mold compound (24) is formed over the die (10) and the tape (18), and then the tape (18) and the plate (16) are removed.

12 Claims, 3 Drawing Sheets

METHOD OF PACKAGING SEMICONDUCTOR DIE WITHOUT LEAD FRAME OR SUBSTRATE

BACKGROUND OF THE INVENTION

The present invention relates to the packaging of integrated circuits (ICs) and more particularly to a method of packaging a semiconductor die without a lead frame or a substrate.

Lead frames and substrates are widely used in semiconductor packaging as carriers for semiconductor dice. Apart from providing mechanical support, lead frames and substrates also serve as an electrical interface for the semiconductor dice. Lead frames and substrates are usually permanently incorporated in the final structure of a semiconductor package, and hence form a sizeable part of the fixed material cost of each semiconductor package. Accordingly, to reduce packaging cost, it would be desirable to have a method of packaging a semiconductor die without a lead frame or a substrate.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
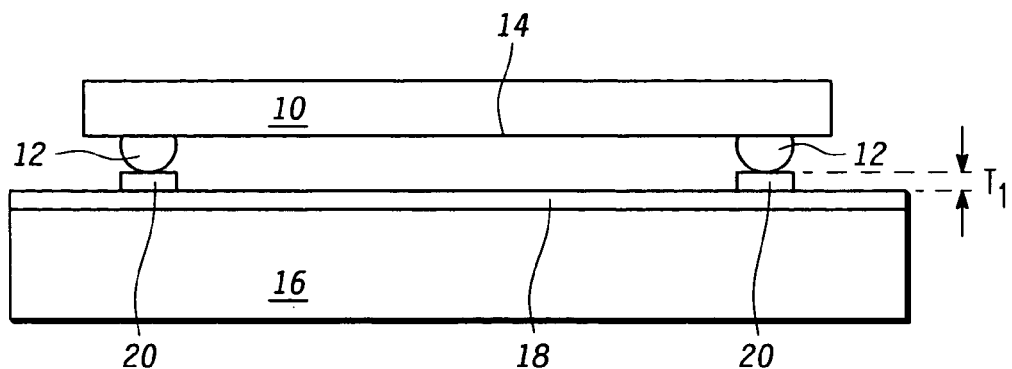
FIG. 1 is an enlarged cross-sectional view of a semiconductor die placed on a plate in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a method of packaging a semiconductor die including the step of providing a flip-chip die with bump connections on a bottom surface thereof. An adhesive tape is attached to a plate surface and lead fingers are formed on the tape. The die is placed on the tape such that the bumps on the die contact respective ones of the lead fingers on the tape. A reflow process is performed on the die, the tape and the plate. A molding process is then performed such that a mold compound is formed over the die and the tape. Finally, the tape and the plate are removed.

The present invention also provides a method of packaging a semiconductor die including the step of providing a flip-chip die with bump connections on a bottom surface thereof. An adhesive tape is attached to a plate surface and lead fingers are formed on the tape. The die is placed on the tape such that the bumps on the die contact respective ones of the lead fingers on the tape. A reflow process is performed on the die, the tape and the plate, which transforms the bumps into interconnects. A molding process is performed such that a mold compound is formed over the die and the tape. Finally, the tape and the plate are removed, thereby forming a semiconductor package. Grinding and polishing may be performed on the package to expose the interconnects.

The present invention further provides a method of packaging a semiconductor die including the step of providing a flip-chip die with bump connections on a bottom surface thereof. An adhesive tape is attached to a plate surface and lead fingers and a heat sink are formed on the tape. The die is placed on the tape such that the die is supported by the heat sink and the bumps on the die contact respective ones of the lead fingers on the tape. A reflow process is performed on the die, the tape and the plate. The bumps and the lead fingers melt during the reflow process and form controlled collapse chip carrier connection (C5) type interconnections when cooled. A molding process is performed such that a mold compound is formed over the die and the tape. Finally, the tape and the plate are removed.

FIGS. 1 through 4 are enlarged cross-sectional views that illustrate a method of packaging a semiconductor die in accordance with an embodiment of the present invention.

Referring now to FIG. 1, a flip chip die 10 with bump connections 12 on a bottom surface 14 thereof is provided. In addition, a plate 16 with an adhesive tape 18 attached to a surface thereof is also provided. Lead fingers 20 are formed on the tape 18. Then, the die 10 is placed on the tape 18 such that the bump connections 12 of the die 10 contact respective ones of the lead fingers 20 on the tape 18.

The die 10 may be any type of circuit such as, for example, a digital signal processor (DSP) or a special function circuit. The die 10 is not limited to a particular technology such as CMOS, or derived from any particular wafer technology. Further, the present invention can accommodate various size die, for example, the die 10 may be about 10 mm by about 10 mm in size. The bumps 12 are made of a conductive metal such as gold, copper, or a metal alloy and are formed on the die 10 using a known wafer bumping process. Such flip-chip bumped die are known by those of skill in the art and therefore, further explanation is not necessary for a complete understanding of the invention.

The plate 16 may be made of any suitable material that is relatively strong and can withstand heat, such as the temperatures at which reflow operations are performed. Examples of such materials are ceramic, stainless steel, copper or the like. Copper may be used based on cost and conductivity considerations. In other instances, ceramic may be preferred ceramic is able to withstand continuous reuse. The plate 16 preferably is reusable. The adhesive tape 18 attached to the plate 16 is preferably a high temperature tape that is able to withstand temperatures greater than about 360° C. Such tapes are known by those of skill in the art and readily commercially available. The lead fingers 20 may be formed on the tape 18 by solder cladding, that is, by screen printing a layer of solder paste on predetermined areas of the tape 18 using a stencil, such as a stainless steel stencil, and subjecting the solder paste to a reflow process. The lead fingers 20 may have a thickness $T_1$ of about 18 microns and are preferably formed of a eutectic solder clad material having a reflow temperature in a range from about 160° C. to about 230° C., such as a Pb63Sn37 solder with a reflow temperature of about 183° C.

By placing the bumps 12 on the die 10 over respective ones of the lead fingers 20 on the tape 18, a high standoff is created between the die 10 and the tape 18. The high standoff facilitates the flow of a mold compound between the bumps 12 during a subsequent molding process and prevents the formation of voids in the resultant semiconductor package.

Figure 2:
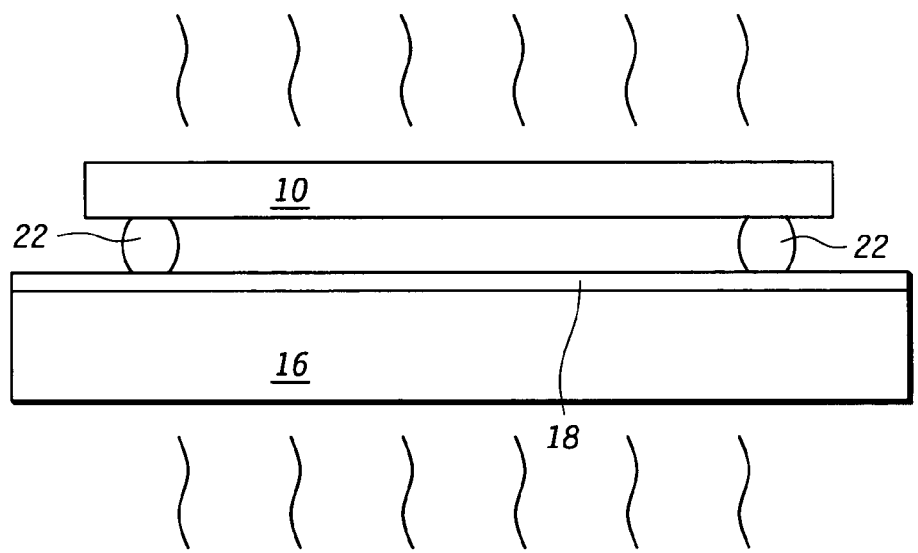
FIG. 2 is an enlarged cross-sectional view of the die and the plate of FIG. 1 undergoing a reflow process.

Referring now to FIG. 2, a reflow process is performed on the die 10, the plate 16 and the tape 18 using a reflow oven. In this particular example, the die 10, the plate 16 and the tape 18 are reflowed at a temperature of about 220° C. Nonetheless, those of skill in the art will understand that the present invention is not limited by the temperature of the reflow process. The purpose of the reflow process is to melt the bumps 12 and the lead fingers 20 to form controlled collapse chip carrier connection (C5) type interconnects 22. The range of temperature for reflowing usually is less than about 360° C., which is well below the melting point of copper in case the plate 16 is made of copper.

Figure 3:
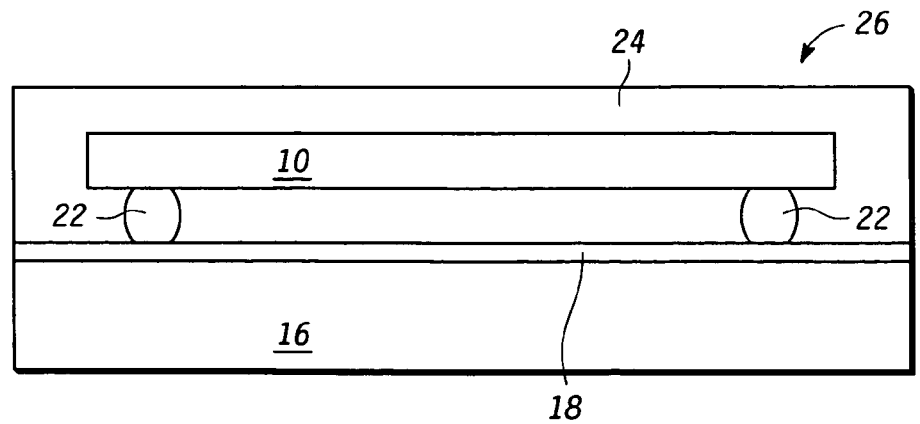
FIG. 3 is an enlarged cross-sectional view of the die of FIG. 2 being encapsulated by a mold compound.

Referring now to FIG. 3, a molding process is performed on the die 10 of FIG. 2. More particularly, a mold compound 24 is formed over the die 10 and the tape 18 such that it covers or encapsulates the die 10, the interconnect 22 and a portion of the tape 18, thus forming a semiconductor package 26. The mold compound 24 comprises well-known commercially available molding materials such as plastic or epoxy.

Figure 4:
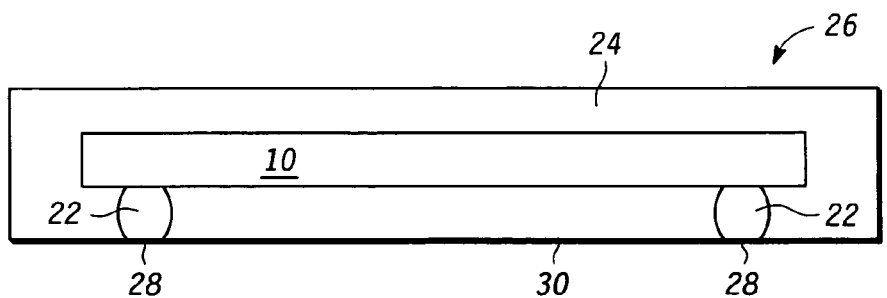
FIG. 4 is an enlarged cross-sectional view of the semiconductor package of FIG. 3 with the plate removed.

Referring now to FIG. 4, the plate 16 and the tape 18 are removed from the semiconductor package 26, which exposes a bottom surface 28 of the C5 interconnects 22 on a bottom surface 30 of the package 26. Because residual quantities of the tape 18 and the mold compound 24 may be retained on the bottom surface 30 of the package 26, grinding or polishing may be carried out to expose the bottom surface 28 of the C5 interconnects 22.

As is evident from the foregoing description, the present invention does away with the need for a lead frame or a substrate for packaging the semiconductor die 10 by using the plate 16 and the tape 18 as a temporary substrate instead. By eliminating the use of lead frames and substrates from the packaging process, packaging cost is reduced. Further, because the plate 16 is reusable, additional cost savings are achieved with the present invention.

Figure 5:
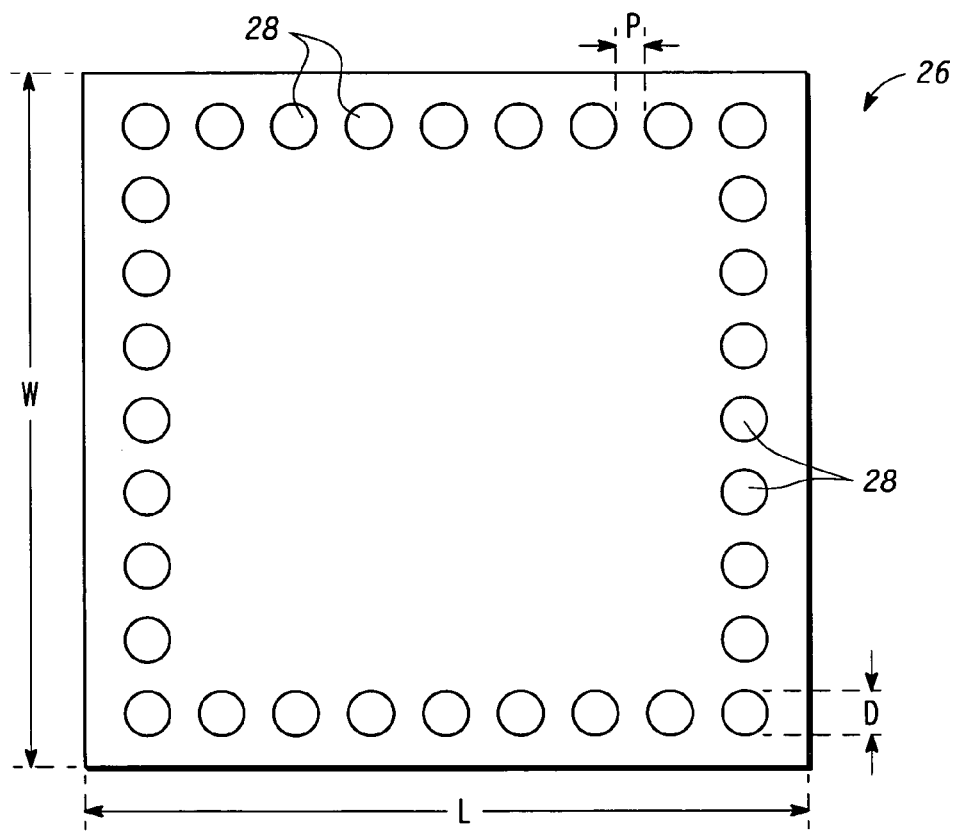
FIG. 5 is an enlarged bottom plan view of the semiconductor package of FIG. 4.

Referring now to FIG. 5, an enlarged bottom plan view of the semiconductor package 26 of FIG. 4 is shown. As can be seen, the C5 interconnects 28 in this particular example are in a perimeter array configuration. Nevertheless, it will be understood by those of skill in the art that the present invention is not limited by the configuration of the interconnects 28. In an alternative embodiment, the interconnects 28 may be in an area array configuration. In one embodiment of the present invention, the package 26 has a length L of about 2.9 mm and a width W of about 2.8 mm, approximately 75 Inputs and Outputs (IOs), a pitch P of about 115 um and interconnect diameters D of about 110 um. However, although specific dimensions of the package 26 are described herein, those of skill in the art will understand that the present invention is not limited to the described dimensions.

FIGS. 6 through 9 are enlarged cross-sectional views that illustrate a method of packaging a semiconductor die in accordance with another embodiment of the present invention.

Figure 6:
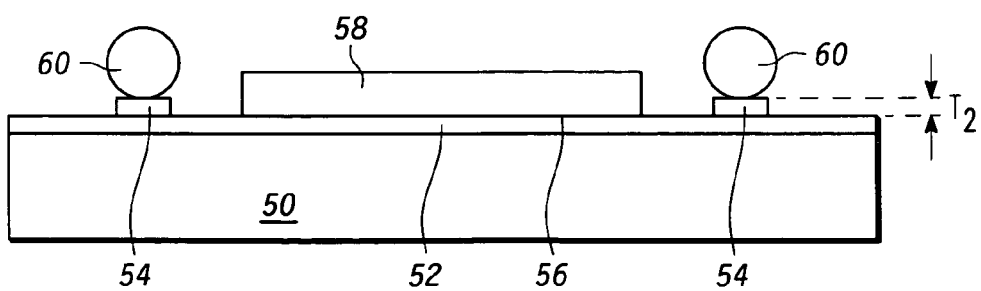
FIG. 6 is an enlarged cross-sectional view of a plate with an adhesive tape attached to a surface thereof in accordance with another embodiment of the present invention.

Referring now to FIG. 6, a plate 50 having an adhesive tape 52 attached to a surface thereof is shown. Lead fingers 54 are formed on the tape 52, and a first or bottom surface 56 of a heat sink 58 is attached to the tape 52. Balls 60 are placed on respective ones of the lead fingers 54 to provide a larger surface area for a subsequent wire bonding step. The balls 60 are formed on the lead fingers using a well known method of applying solder balls to a substrate. Alternatively, as discussed below, the balls 60 may be formed during a wire bonding process, particularly, using a ball bonding process, where ball bonds are formed on the lead fingers 54.

The plate 50 may be made of any suitable substrate material, such as metal, metal-alloy or ceramic. The adhesive tape 52 attached to the plate 50 is preferably a high temperature adhesive tape that is able to withstand temperatures greater than about 360° C. The lead fingers 54 are formed on the tape 52 by solder cladding, that is, by screen printing a layer of solder paste on predetermined areas of the tape 52 using a stencil, such as a stainless steel stencil, and subjecting the solder paste to a reflow process. The lead fingers 54 may have a thickness $T_2$ of about 4-5 mm and are preferably formed of a eutectic solder clad material having a reflow temperature in a range from about 160° C. to about 230° C. The heat sink 58 may be made of copper or other thermally conductive material and is attached to the tape 52 with an adhesive or in any other known manner. Alternatively, the heat sink 58 may be formed on the tape 52 in the same manner and from the same material as the lead fingers 54. The balls 60 are solder balls of the type used for forming controlled collapse chip carrier connections (C5) and have a diameter of about 25 mm.

Figure 7:
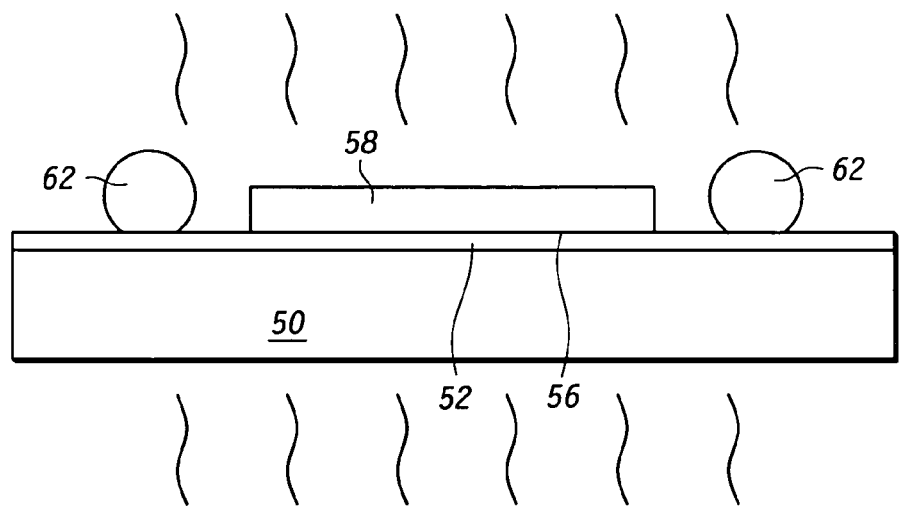
FIG. 7 is an enlarged cross-sectional view of the plate of FIG. 6 undergoing a reflow process.

Referring now to FIG. 7, a reflow process is performed on the plate 50 of FIG. 6 by passing the plate 50 through a reflow oven. In this particular example, the plate 50 is reflowed at a temperature of about 220° C. Nonetheless, it should be understood that the present invention is not limited by the temperature of the reflow process. The balls 60 and the lead fingers 54 on the tape 52 melt during the reflow process and form bumps 62 when cooled.

Figure 8:
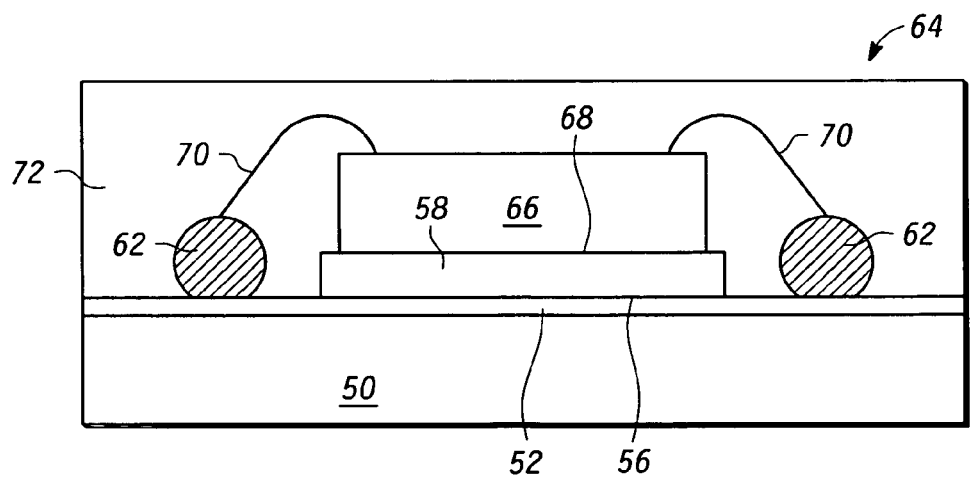
FIG. 8 is an enlarged cross-sectional view of a semiconductor package formed using the plate of FIG. 7.

Referring now to FIG. 8, a semiconductor package 64 formed using the plate 50 of FIG. 7 is shown. A semiconductor die 66 is placed on and attached to a second or top surface 68 of the heat sink 58. Bond pads (not shown) on the die 66 are electrically connected to respective ones of the bumps 62 on the tape 52 with a plurality of wires 70. In one embodiment, the wires 70 are connected to the die 66 bond pads and the bumps 62 via wire bonding, for example with thermo-sonic stitch bonds to the bumps 62. In another embodiment, holes (not shown) for receiving one end of the wires 70 are punched in the bumps 62. In yet another embodiment, the bumps 62 are formed by ball bonds made on the lead fingers 54 and then reflow is performed to form the bumps 62. The die 66, the wires 70, portions of the bumps 62, the heat sink 58 and a surface of the tape 52, are covered or encapsulated by a mold compound 72 to form the semiconductor package 64.

The die 66 may be any type of circuit such as, for example, a digital signal processor (DSP) or a special function circuit, and is not limited to a particular technology such as CMOS, or derived from any particular wafer technology. The die 66 is attached to the heat sink 58 in a known manner, such as with an adhesive material layer or an adhesive tape. The wires 70 may be made of gold (Au), copper (Cu), aluminium (Al) or other electrically conductive materials as are known in the art and commercially available. The mold compound 72 may comprise well-known commercially available molding materials such as plastic or epoxy.

Figure 9:
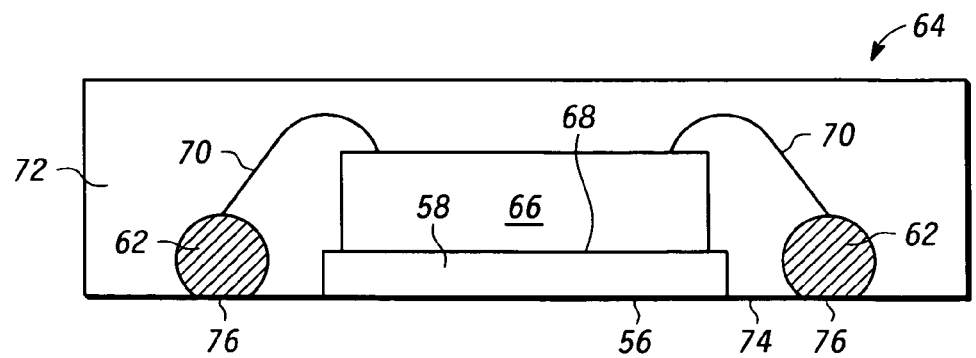
FIG. 9 is an enlarged cross-sectional view of the semiconductor package of FIG. 8 with the plate removed.

Referring now to FIG. 9, the tape 52 and the plate 50 are removed from a bottom surface 74 of the package 64 of FIG. 8 to expose the bottom surface 56 of the heat sink 58, as well as the bottom surface 76 of the bumps 62 on a bottom surface 74 of the package 64. Because residual quantities of the tape 52 may be retained on the bottom surface 74 of the package 64, grinding or polishing may be carried out for better exposure of the bottom surface 76 of the bumps 62.

It is noted that a heat sink like the heat sink 58 may be attached to the tape 18, and the die 10 attached to such heat sink, for the package 26 discussed above with reference to FIGS. 1-4. In such a case, the die 10 used would have flip chip bumps arranged around its periphery, as opposed to an array pattern of bumps.

As is evident from the foregoing discussion, the present invention provides an inexpensive method of packaging a semiconductor die. Packaging cost is substantially reduced because lead frames and substrates are not required in present invention. Additionally, the packaging process of the present invention is simple as it does not involve complex processing steps such as, for example, sawing through a metal lead frame.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, although QFN packages have been described, other package types such as, for example, Land Grid Array (LGA) packages can also be formed with the present invention. It is understood, therefore, that this invention is not limited to the particular embodiments disclosed, but covers modifications within the spirit and scope of the present invention as defined by the appended claims.

The invention claimed is:

1. A method of packaging a semiconductor die, comprising:
    attaching an adhesive tape to a plate surface;
    forming lead fingers on the tape;
    forming a heat sink on the tape;
    providing a semiconductor IC die with bonding pads on a top surface thereof;
    placing a bottom surface of the die on the heat sink;
    electrically connecting respective ones of the die bonding pads with respective ones of the tape lead fingers with a plurality of wires, wherein the connections of the wires to the lead fingers are ball bonds;
    performing a reflow process on the die, the tape and the plate, wherein the ball bonds and the lead fingers melt during the reflow process and form controlled collapse chip carrier connection (C5) type interconnects when cooled;
    performing a molding process, wherein a mold compound is formed over the die and the tape; and
    removing the tape and the plate such that the heat sink and a surface of the C5 type interconnects are exposed.

2. The method of packaging a semiconductor die of claim 1 wherein the bumps and the lead fingers melt during the reflow process and form controlled collapse chip carrier connection (C5) type interconnects when cooled.

3. The method of packaging a semiconductor die of claim 2, further comprising grinding the packaged die to expose the C5 type interconnects.

4. The method of packaging a semiconductor die of claim 1, wherein the adhesive tape is a high temperature tape.

5. The method of packaging a semiconductor die of claim 4, wherein the tape is able to withstand temperatures greater than about 360° C.

6. The method of packaging a semiconductor die of claim 1, wherein the bumps are in one of an area array and a peripheral array configuration.

7. The method of packaging a semiconductor die of claim 6, wherein the die is less than or equal to about 10 mm by about 10 mm in size.

8. The method of packaging a semiconductor die of claim 1, wherein the lead fingers and the heat sink are formed on the tape by solder cladding.

9. The method of packaging a semiconductor die of claim 8, wherein the lead fingers have a thickness of about 18 microns.

10. The method of packaging a semiconductor die of claim 1, wherein the plate is reusable.

11. The method of packaging a semiconductor die of claim 10, wherein the plate is made of one of copper, ceramic, and stainless steel.

12. The method of packaging a semiconductor die of claim 1, wherein the die, the tape and the plate are reflowed at a temperature of about 220° C.

* * * * *